United States Patent
McDowell (10) Patent No.: US 10,845,441 B1
(45) Date of Patent: Nov. 24, 2020

(54) CONTINUOUSLY ADJUSTABLE PASSIVE SHIMS FOR MAGNETS

(71) Applicant: NuevoMR, LLC, Albuquerque, NM (US)

(72) Inventor: Andrew F. McDowell, Albuquerque, NM (US)

( * ) Notice: Subject to any disclaimer, the term of this patent is extended or adjusted under 35 U.S.C. 154(b) by 5 days.

(21) Appl. No.: 16/162,022

(22) Filed: Oct. 16, 2018

Related U.S. Application Data (60) Provisional application No. 62/573,443, filed on Oct. 17, 2017.

(51) Int. Cl.
   *G01R 33/3873* (2006.01)
   *H01F 7/02* (2006.01)

(52) U.S. Cl.
   CPC ....... *G01R 33/3873* (2013.01); *H01F 7/0278* (2013.01)

(58) Field of Classification Search
   CPC .................................................. G01R 33/3873
   USPC .......................................................... 324/320
   See application file for complete search history.

(56) References Cited

U.S. PATENT DOCUMENTS

| | | |
|---|---|---|
| 4,631,481 A | 12/1986 | Young et al. |
| 4,999,600 A * | 3/1991 | Aubert ................. G01R 33/383 324/318 |
| 5,045,794 A | 9/1991 | Dorri et al. |
| 5,235,284 A | 8/1993 | Tahara |
| 5,343,183 A | 8/1994 | Shimada et al. |
| 6,181,137 B1 | 1/2001 | Havens et al. |
| 6,294,972 B1 | 9/2001 | Jesmanowicz et al. |
| 6,313,634 B1 | 11/2001 | Kasten |
| 7,405,567 B2 | 7/2008 | McDowell |
| 8,575,934 B2 * | 11/2013 | Iwasa ................. G01R 33/3873 324/318 |
| 9,285,441 B1 | 3/2016 | McDowell |

(Continued)

OTHER PUBLICATIONS

Anderson, W.A., "Electrical Current Shims for Correcting Magnetic Fields", The Review of Scientific Instruments, Mar. 1961, vol. 32, No. 3, USA.

(Continued)

*Primary Examiner* — Reena Aurora
(74) *Attorney, Agent, or Firm* — Rod D. Baker (57) ABSTRACT

Apparatus or system for homogenizing or modifying the magnetic fields of magnets, particularly the magnetic fields employed in nuclear magnetic resonance (NMR) and magnetic resonance imaging (MRI) applications. The apparatus features passive structures for making magnetic field homogenizations or modifications, and specifically permits the production of desirable correction fields in which the correction field strength has a continuously adjustable value of field strength. Passive shim structures are provided and manipulated so to create correction fields that can have a continuously adjusted value of field strength, such that errors in the original field can be corrected with high fidelity. The passive structures may be physically modified or adjusted by rotation so that truly continuous adjustment of strength and orientation of the corrective fields may be achieved. Also, the passive structures may be manipulated or rotated in a time-dependent fashion so to produce time-dependent modifications to a magnetic field.

15 Claims, 8 Drawing Sheets

(56) References Cited

U.S. PATENT DOCUMENTS

| | | | |
|---|---|---|---|
| 2008/0024130 A1* | 1/2008 | Schlueter | G01R 33/381 |
| | | | 324/309 |
| 2008/0054902 A1 | 3/2008 | Juchem | |
| 2015/0323627 A1 | 11/2015 | Mallet | |
| 2018/0246180 A1* | 8/2018 | Abe | G01R 33/243 |
| 2019/0302205 A1* | 10/2019 | Stainsby | A61B 5/055 |

OTHER PUBLICATIONS

McDowell, A. et al., "Thin High-order Shims for Small Dipole NMR Magnets," Journal of Magnetic Resonance, Apr. 24, 2017, vol. 281, 7-16.

McDowell, A.F., "Adjustable Passive Shims for Dipole NMR Magnets," Journal of Magnetic Resonance, Sep. 22, 2018, vol. 296, 143-151.

* cited by examiner

CONTINUOUSLY ADJUSTABLE PASSIVE SHIMS FOR MAGNETS

CROSS-REFERENCE TO RELATED APPLICATIONS

This application claims the benefit of the filing of U.S. Provisional Application Ser. No. 62/573,443 entitled "Continuously Adjustable Passive Shims for Magnets," filed on Oct. 17, 2017, and the entire disclosure thereof is incorporated herein by reference.

FIELD OF THE INVENTION

This invention relates generally to methods and apparatuses for homogenizing or modifying the magnetic fields of magnets, particularly the magnetic fields employed in nuclear magnetic resonance (NMR) and magnetic resonance imaging (MRI) applications, and more particularly to passive structures for making such homogenizations or modifications, and specifically to a method and apparatus for creating desirable correction fields in which the correction field strength has a continuously adjustable value of field strength.

BACKGROUND OF THE INVENTION

Strong, uniform magnetic fields are desirable in many situations. Examples include scientific instruments, devices for measuring important industrial parameters, apparatus for achieving certain effects on samples or materials, devices for education or student experimentation in instructional settings, and many others. Often, a device or phenomenon that relies on or incorporates a magnetic field in its operation will be improved if the field is more uniform in strength. Such improvements may be an increase in speed, efficiency, precision, resolution, stability, sensitivity, or other feature of the device, measurement, or process. A more uniform magnetic field may also allow the use of smaller, weaker, and/or less expensive magnets to achieve a desired goal.

In other cases, improvements in device performance may result from a magnetic field having a particular non-uniform field strength distribution throughout a region of space. Often, and in particular for the present disclosure, methods for homogenizing magnetic fields can also be used to accurately achieve particular non-uniform target field distributions. In some cases, for example in MRI applications, the device function requires that the magnetic field be modified in a time-dependent manner, for example by creation of field gradients during certain time intervals.

Many methods for homogenizing or correcting the magnetic field of magnets have been developed. Mechanical methods, including precise design and shaping of the magnet's pieces, attention to accurate positioning during the assembly of the magnet, careful selection of uniform and/or matched pieces of permanent magnetic material, and careful adjustment of the relative positions of the magnet pieces after initial assembly, have been used. Post-assembly mechanical adjustments, including screws to alter some or all of the positions of the magnet's constituent pieces, movement of magnet pieces or other structures that control the distribution of magnetic flux lines in space, and large-scale distortions of the magnet structure are all examples of mechanical methods for improving the field homogeneity of magnets. This list of mechanical methods is not exhaustive. For example, magnets may be disassembled and then reassembled with new thin pieces or "shims" incorporated so that the relative positions of the magnet's constituents are altered, changing the shape of the magnetic field. Other examples of past efforts to adjust, with mechanical shimming, a magnetic field include U.S. Pat. No. 4,631,481 to Young et al., U.S. Pat. No. 5,235,284 to Tahara et al., U.S. Pat. No. 5,343,183 to Shimada et al., and U.S. Pat. No. 6,313,634 to Kasten.

Of present relevance are techniques generally known as "passive shimming," in which additions of extra pieces of material on the surface of, or in the interior and/or exterior of, the magnet are used to change the magnetic field in a manner that does not require electrical current. Passive shimming is frequently achieved through the careful placement of small pieces (known as "buttons") of highly magnetizeable materials (low-carbon steel, nickel, or similarly magnetically responsive materials) or of permanent magnet materials such as neodymium-iron-boron, samarium-cobalt, or other like materials known in the art. The buttons are discrete pieces of various sizes, and the locations, orientation, sizes, and number of buttons needed to correct the field are determined using magnetic field measurements, magnetic field calculations or simulations, or combinations of these and other techniques well known in the art (see, as an example, U.S. Pat. No. 5,045,794 to Dorri).

Another approach to passive shimming is described in U.S. Pat. No. 6,897,750 to Neubarth, which teaches a device for adjusting a spatial dependence of a magnetic field which utilizes self-supporting magnetic foils or sheets that surround the working volume. The sheets or foils have openings or holes of various shapes, sizes, and positions so that the sheets or foils create a desirable effect on the magnetic field. The device may have several layers, for example as a continuous foil wrapped around the working volume multiple times and attached at two places or more, and different layers may have different shapes of openings. The shapes may be made at different rotated orientations so as to produce the desired magnetic field. U.S. Pat. No. 6,897,750 further teaches field shaping elements having several layers that are disposed in operational positions around a working volume such that they may be mutually turned and fixed.

Non-mechanical methods are likewise possible. The non-mechanical methods often have the attractive characteristic of continuous adjustability, ease of adjustment, ease of automation, and the ability to be mass produced rather than tailored for each individual magnet. One common non-mechanical method utilizes wires that carry electrical current. Such currents create magnetic fields in the region of space around the wires. These fields are strongest near the wires and have a spatial distribution of strength and orientation. By carefully selecting the locations and adjusting the currents in such wires, the magnetic field can be made more homogeneous because the magnetic fields due to the currents can counteract some or all of the inhomogeneities present in the field of the original magnet. By analogy with the thin sheets or strips of metal (e.g., shim stock) that have sometimes been used to mechanically adjust magnets, the coils of wire have come to be known as "shims" or "shim coils." Various methods known in the art may be used to optimize the positions of the wires. Further methods known in the art may be used to optimize the current values in each shim coil in order to achieve the desired field correction, a process referred to as "shimming the magnet."

Current-carrying wires may also be used to modify the magnetic field in a time-dependent manner, for example to produce pulses of magnetic field gradient utilized in MRI by applying pulses of current to one of more of the active shim wires. In many cases, dedicated wires for the production of the gradient pulses are utilized in place of the linear shim wires. It is common to refer to such wires or structures and the fields they produce as "gradients" rather than as "shims."

Non-mechanical methods may be used in conjunction with one or more of the mechanical methods. Mechanical adjustments are often preferred for making large corrections or modifications, since these can be made without requiring large electrical currents which may be detrimental to the magnet performance. On the other hand, non-mechanical adjustments are often preferred for fine correction of the residual field defects because currents can be adjusted in a continuous manner to achieve the required fine adjustment. Non-mechanical methods are typically used to produce time-dependent field modifications because it is relatively straightforward to produce pulses of electrical current, whereas the mechanical shimming methods are more usually treated as fixed, permanent adjustments.

SUMMARY OF THE INVENTION

The presently disclosed apparatus and method combines the advantageous features of both non-mechanical and mechanical methods for field correction and modification. There are disclosed herein innovative designs and adjustment methods for passive structures for creating the field corrections or modification. As disclosed herein, the passive structures are produced and manipulated in a way that creates correction fields that can have a continuously adjusted value of field strength, so that errors in the original field can be corrected with high fidelity. The passive structures may be physically modified or adjusted by rotation so that truly continuous adjustment of strength and orientation of the corrective fields may be achieved. In a second embodiment, the passive structures may be manipulated or rotated in a time-dependent fashion so to produce time-dependent modifications to a magnetic field.

The disclosed passive design may be useful for magnets made from permanent magnet technology, superconducting magnet technology, electromagnet technology or other magnet technologies. It may be useful in magnets with planar or cylindrical or hybrid geometries, and with magnets possessing any orientation of their magnetic field with respect to the magnet body itself. It may be useful for magnets that are designed to create a particular form of field distribution rather than a uniform field. The disclosed passive shim designs and methods are well-suited for correcting the magnetic fields of nominally uniform dipole magnets.

Advantages and Benefits

The disclosed design is for passive structures or shims, meaning that they do not require the presence of an electrical current to produce a corrective magnetic field. Hence, the design of the present apparatus and system enjoys the advantages of passive shims: the elimination of the need for a current source that produces the desired field strength, with adequate current stability over time to meet the requirements of the apparatus in which the magnetic field is used. A further advantage is that there is no power dissipation from these passive structures, eliminating any heating effects that may affect the magnet or other parts of the apparatus in which the magnet is used. The field adjustment apparatus may therefore be simplified to reduce cost and space utilization, and to improve reliability.

Passive shims typically provide corrective fields much stronger than those that can be achieved with active shim technologies. The main drawback with passive shimming technologies is that they may be adjusted in strength only during construction and lack easy subsequent adjustability. There is typically no possibility to adjust the passive shims once they have been installed in the magnet, short of removing them and replacing them. This places a high burden on the passive shim design and construction process, and eliminates the possibility that the shims could be easily adjusted in response to changes in the magnet over time, or to the effects of placing new samples or new parts of the apparatus into or near the working volume of the magnet. So the advantages of the strong corrective fields of passive shims may appear to be limited by these drawbacks.

Another limitation of a typical implementation of passive shimming is that the shim design is aimed at correcting the overall magnet field shape, whereas a typical implementation of active shimming utilizes a shim design that aims to correct the magnetic field by correcting individual components of the magnetic field, for example, the harmonic components of the field, a concept well known in the art. Typical active shim designs also allow for adjustability of the individual component corrections through the control of the electrical currents in the various active shim elements. Such control and adjustability of individual field components improves the quality of the field correction that can be achieved. Typical passive shim designs lack the facility to adjust the correction of individual field components.

In addition, typical passive shim methods must overcome the challenge posed by the lack of continuous adjustability in the field strength of the materials used to construct these shims. For example, the button shimming practitioner is limited to the use of a finite set of discrete button sizes and strengths. Likewise, the use of foils or sheet stocks has a limitation imposed by the finite and discrete values of foil or sheet thicknesses that are available. These limitations usually mean that the quality of field correction or modification is limited. This is a particularly important limitation when high precision corrections or modifications are needed.

A further limitation of typical passive shims for magnets is that the passive shim structure must be designed and constructed for each magnet individually. Even when a number of magnets of the same design are shimmed, the passive shim structure for each one is different and will not work properly in a different magnet. This situation is in distinction to the application of active shims, which may be mass-produced for use in any of a series of magnets of the same design. The corrections or modifications to the fields of each of these magnets is readily implemented by adjusting the active shim currents to values that may be unique to each magnet. No specialized per-magnet construction is required.

The new passive field adjustment technology according to this disclosure overcomes these limitations by allowing the strong passive shims or structures to be adjusted continuously over a range of strength and orientation values. The concept that allows this advantage is to construct the passive shims in particular sets of shim structures, and allow the structures of each set to be oriented independently in space. The effect of this innovation is to enable the production of a range of corrective field values and orientations that can be adjusted continuously by the manipulation of the orientations of the structures. Since the angular orientation values of the structures are continuously variable parameters, the angular adjustment allows for a continuously adjustable passive shim.

An apparatus to adjust the magnetic field of a magnet may be constructed on the basis of the technology disclosed hereby. For example, the device may consist of one or more sets of structures capable of creating magnetic fields. Each such set may contain two or more structures. The distribution of magnetic field in space produced by each structure has a fixed shape and strength and orientation relative to the orientation of that structure. The structures may be positioned with any angular orientation, and they may be used simultaneously to create a total contribution to the magnetic field distribution. As discussed further herein, the structures are positionable at any angular orientation within one or more a plurality of ranges of orientations. The distribution of magnetic field in space created by this set of structures may have a distinct shape, strength, and orientation in space. The structures may have a designated axis of rotation, which may be related to a physical element of the structure or may be an abstract mathematical axis. The structures of a given set of structures may share a designated axis of rotation in common. The structures may be positioned so that their designated axes are always at the same location in space. The structures may be capable of being positioned with any angular position. The structures may be capable of being used simultaneously, with each structure adopting an angular orientation not constrained by orientations of the other structures. The magnetic field distribution created by the plurality of structures has a definite shape, with a strength and orientation being adjustable through the independent adjustment of the orientations of the individual structures.

Each structure of a given set may individually create the same distribution of magnetic field in a region of space as the other structures in that set. As explained in more detail below, the net magnetic field distribution of the structures of one set of structures may be the same shape as the distribution of field produced by any individual of that set of functions, but the strength and/or orientation of the net magnetic field distribution may be different from the magnetic field distribution of an individual structure. As explained further herein, in one embodiment the magnetic field distribution created by the structures is described by a real-valued spherical harmonic function.

A number of advantages result from the fact that, once constructed, the shim structures may themselves not need to be altered. The shim structures may be constructed from readily available materials, even if those materials create corrective fields that are stronger than desired. The shim structures may be constructed from materials that simplify their production and complexity, lowering their cost and improving their reliability. For example, simple sheet stock may be used to build the structures. Magnetically soft or magnetically hard material may be used. The design and construction may be adjusted so that the resulting structures perform optimally, by changing the shape or thickness or materials, or any other physical aspect of the shim structures. Once optimized, these shim structures need not be further changed in order to adjust the strength and orientation of the corrective field produced by the set of structures. Hence, the optimizations carried out in the design and construction of the structures are preserved during their utilization in correcting or modifying a magnet.

An additional advantage made possible by the here-disclosed technology is that the shims may be designed for a generic or model magnet of a particular design. Adjustments for the idiosyncratic features of individual magnets of that design may be made through the simple mechanical adjustment of re-orientation or rotation, without necessitating the use of anything other than the generic shim device. For example, this facet of the new technology may facilitate new magnet-production-workflows, in which a set of magnets is mass produced, and a set of identical shim devices is mass produced independently, and then each of the magnets is fitted with one of the identical shim devices which is subsequently adjusted by reorientation of the individual structures to account for the individual magnet field anomalies of that particular magnet. Thus, when the structures are mass produced, the magnetic fields of a plurality of magnets may be adjusted using the mass-produced structures. This type of workflow may allow levels of automation and economies of scale unavailable to technologies where each passive shim structure must itself be built according to the idiosyncratic anomalies of each individual magnet.

The separation of the magnet production and shim structure production may also speed the overall production by eliminating delays in the individual shim structure production. When passive shims must be constructed according to the properties of individual magnets, these delays often occur when the passive shim production process required a drying, curing, or setting time, or the construction to compensate for the individual characteristics of a magnet is intricate or complicated or otherwise prone to errors in construction. Any of these or other steps in the production process may cause delays as an individual shim structure is produced to match an individual magnet. The passive shim technology disclosed herein has an advantage over these previously known techniques in that the production of the shim structures is generic and the same for all magnets of a production run. The correction of the individual characteristics of single magnets is achieved through an adjustment step, independent of the shim structure production process.

A further advantage is that more than one adjustment process is possible. For example, an individual magnet may be measured to determine the corrective fields needed, and then a previously-produced shim device may be adjusted by positioning the various shim structures in the orientations known to produce the strengths and orientations needed to correct the magnet, and this adjusted shim device may then be placed into the magnet. As another example, the previously-produced shim device may be placed into the magnet first, and then the orientation of the structures may be adjusted by rotating them so as to best correct the magnet's field. As another example, the structures may be oriented in a manner believed to be the optimal orientations needed to shim the magnet, and the orientations may be corrected to achieve improvements in the quality of the shim in an iterative process. The orientations may be adjustable only within a restricted range or ranges of values. Other adjustment processes are possible, including combination of adjustments made with the shim device outside and inside the magnet.

The adjustability of the shim designs and methods disclosed herein also allows a new function for such shims, ones not possible with existing passive shim technologies. The fields produced by the shim device may be changed dynamically, for example, during some measurement being performed by the apparatus containing the magnet. For example, in a Magnetic Resonance Imaging (MRI) device, it may be useful to create a linear field gradient for a short period of time. This is known as a field gradient pulse. Using the newly disclosed shimming technology, such a short-term pulse of gradient field may be produced by a short-term reorientation of the shim structures devoted to creating linear gradients. The structures may be moved quickly from an original set of orientations to a second set of orientations appropriate for creating the desired field gradient during the time of the pulse. The pair of elements may be returned to their original orientational positions at the end of the pulse duration, or they may be positioned in a new manner to produce a new gradient field. Any sort of mechanical or electrical means may be employed to effect the switches in orientational position required to produce the required pulsed field gradient. The pulsed gradients may consist of a set of multiple different values implemented at different times throughout the MRI data acquisition time, for example as a set of phase encode gradients or other gradients playing different roles in the MRI data acquisition, as is well-known in the art. The pulsed field gradients described here may also be used for the purpose of other measurements, such as diffusion measurements, or other tasks, such as water suppression. Shim structures devoted to producing non-linear corrective fields may also be controlled in a time-dependent manner.

To those of ordinary skill in the art, it will be clear that any existing methods that require time dependent magnetic fields can be usefully implemented using the newly disclosed passive shimming technology. In the past, such time dependent fields have typically been produced using time dependent electrical currents. Such currents are typically large, and require bulky, heavy, and expensive electronics to produce and control. In the case of medical MRI, these currents also give rise to very loud concussive noises or bangs which can cause harm or discomfort to patients. The passive shim technology disclosed herein can avoid the need for the bulky, heavy, and expensive electronics and the potentially damaging noises of known technologies.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings, which are not necessarily to scale within a particular figure or between figures, are only for the purpose of illustrating embodiments of the invention and are not to be construed as limiting the invention. In the drawings:

FIGS. 6A-6D depict diagrammatically the use of an axle to constrain the rotation of shim elements according to the present disclosure: FIGS. 7A-7D depict diagrammatically the use of external constraint to element rotation according to the present disclosure.

DETAILED DESCRIPTION OF PREFERRED EMBODIMENTS

Figure 1A:
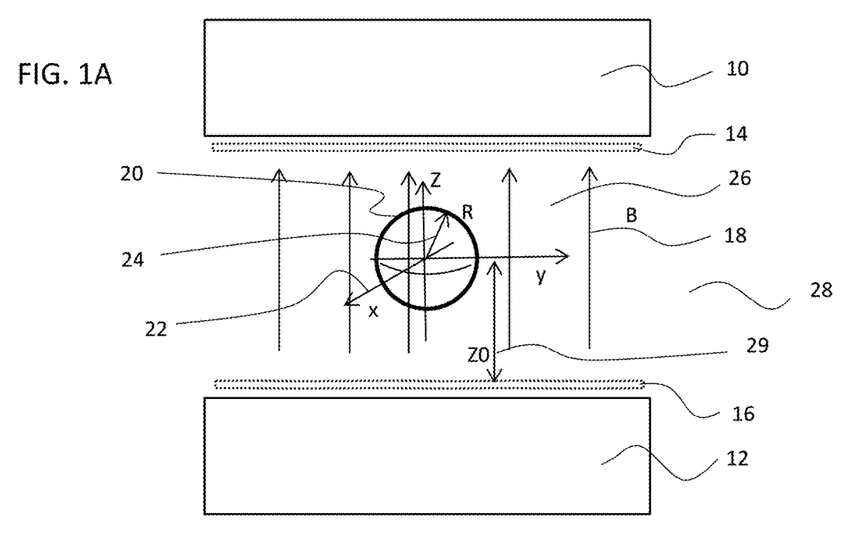
FIG. 1A is a side sectional schematic view of a magnet geometry useable according to the present invention.

To understand the concepts and methods disclosed herein, it is helpful to consider some geometrical definitions. FIG. 1 shows some typical magnet geometries and associated mathematical coordinate systems and volumes of space over which the magnetic field is to be corrected. FIG. 1A shows a typical dipole magnet, which is a common format for magnets built with electromagnetic or permanent magnet technologies. This configuration has a north magnetic pole 10 and a south magnetic pole 12 that define two parallel surfaces facing each other across a gap. The poles are often circular or axially symmetric in general shape; in FIG. 1A they are shown from the side. The magnetic field B 18 points from one pole to the other and is nominally uniform throughout the gap. The coordinate system 22 for this type of magnet is conveniently positioned with its origin at the geometrical center of the gap space and its Z-axis lying along the direction of the magnetic field. The direction of the X and Y axes in the plane perpendicular to the magnetic field may be chosen arbitrarily. The working volume of the magnet, over which the field will be corrected or otherwise modified, lies somewhere in the gap. The working volume may be spherical, ellipsoidal, cylindrical, cubic, or other shape as required to achieve the design goals of the magnet. The working volume may be positioned at the center of the gap or closer to one pole or the other, or one edge or the other of the poles. A common working volume choice is a sphere 20 of radius R 24 centered in the gap region. The shims for a dipole magnet are commonly placed in two planar regions 14, 16, located near either pole. Other locations on or in the magnet are also possible for the shims, such as planes closer to the working volume than the poles, planes or non-planar structures located at other locations in the gap (e.g., in the regions to the sides 26 of the working volume 20), or in locations outside of the magnet gap 28.

Figure 1B:
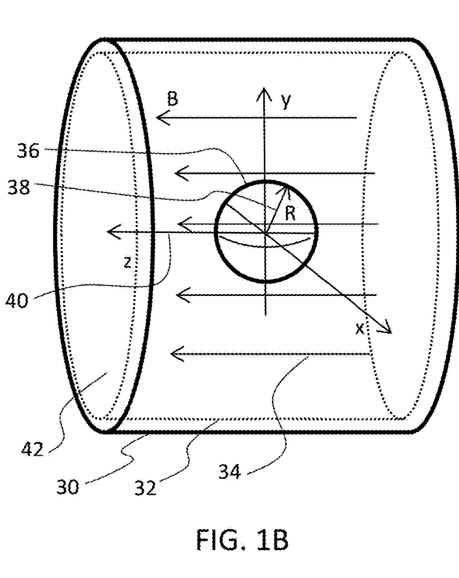
FIG. 1B is a side sectional schematic view of an alternative magnet geometry useable according to the present invention.

FIG. 1B depicts a cylindrical magnet geometry 30 with an axial magnetic field 34, as is typical of magnets built with superconducting magnet technology. The magnetic field is largely parallel to the axis of the cylinder and is nominally uniform inside the cylinder. The coordinate system 40 is conveniently chosen with its origin in the center of the cylindrical volume, and its Z axis in the direction of the field B. The X and Y directions in the X-Y plane may be chosen arbitrarily. The working volume may be taken to be any region of space in the cylinder, with variations similar to those described above for FIG. 1A. FIG. 1B depicts a common choice for working volume: a sphere 36 of radius R 38 centered in the cylinder defined by the magnet. The shims for this magnet geometry are conventionally placed on a cylindrical surface 32 placed inside and close to the inner surface of the cylinder 30 defined by the magnet. Other locations for shims are possible, including planar regions near the cylindrical surface of the magnet, planar regions 42 orientated perpendicular to the magnetic field, or other volumes or regions inside or outside of the cylinder defined by the magnet.

Figure 1C:
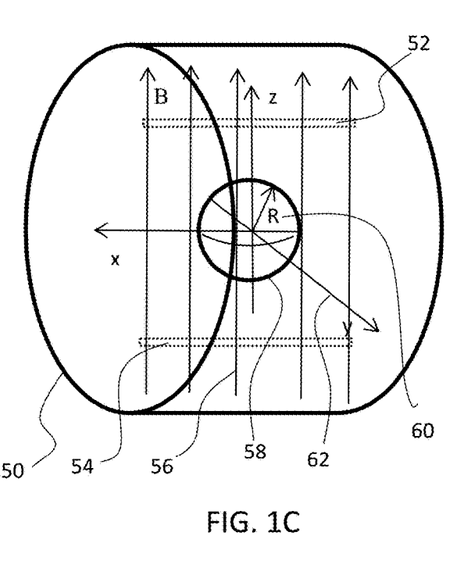
FIG. 1C is a side sectional schematic view of another alternative magnet geometry useable according to the present invention.

FIG. 1C shows a cylindrical magnet geometry 50 with a transverse field 56, as is common for magnets built following generally the known design principles of Halbach. In such magnets, the field is oriented parallel to the diameter of the cylinder and is nominally uniform within the cylinder defined by the magnet structure 50. A convenient coordinate system 62 for this situation has its origin located at the center of the cylinder and its Z axis pointing in the direction of the field B. The direction of the X and Y axes may be chosen arbitrarily in the plane perpendicular to Z. As for the magnet geometries already discussed, the working volume over which the field will be corrected may be any volume or region within the nominally uniform field region. FIG. 1C depicts a common choice for working volume, a sphere 58 of radius R 60 centered in the cylinder defined by the magnet structure. The shims for this magnet geometry may be placed on planar regions 52, 54 oriented perpendicular to the magnetic field and sized to fit within the cylinder. Alternatively, the shims may be placed on a cylindrical surface positioned inside the cylinder defined by the magnet. The shim materials may also be placed on surfaces or volumes of any shape placed at any location inside or outside the cylinder defined by the magnet structure.

The shim systems disclosed herein may also be applied to other magnet geometries not depicted in FIG. 1, for example single-sided or "inside-out" magnets. For any such magnet geometry, a working volume may be defined, with a location and a size parameter denoting its linear dimension (equivalent to the radius of the spheres 20, 36, 58). For example, the radius of the minimal sphere that encloses the non-spherical working volume may be taken as a definition of its size. Also, a mathematical coordinate system may be defined and a location for placement of passive shim materials may be specified.

In the disclosure that follows, the discussion largely centers on the dipole magnet geometry of FIG. 1A. This focus is entirely for convenience and mathematical simplicity. The generalization of the methods and devices disclosed herein to magnets of other geometry assume an understanding of the mathematics, the properties of magnetic fields, and magnetic field correction methods that is to be expected for one of ordinary skill in the art.

For the dipole magnet configuration with planar shims, as depicted in FIG. 1A, the shim structures are typically arranged in a region within the planes 14 and 16 near the poles, for example, by being attached to a planar substrate or to the magnet pole itself. The structures used in the disclosed invention create a magnetic field of a distinct mathematical form in the volume of space over which the field is to be corrected. In a preferred embodiment, this mathematical form is one of the set of mathematical functions known as the real-valued spherical harmonic functions (RVSH functions), as is well-known in the art. These RVSH functions may be labeled by pairs of numbers (N,M), by analogy to the traditional $Y_{lm}$ labeling of the complex-valued spherical harmonic functions. The function (1,1) may also be expressed in Cartesian coordinates as X, and (1,−1) as Y. A partial list of the most commonly used RVSH functions is tabulated in McDowell and Conradi (*J. Magn. Reson.*, 281, 7-16, 2017). The passive shim structure that produces the (1,1) field may itself be referred to as the (1,1) shim, or X shim, and likewise for the shim structures that create the other RVSH fields.

Figure 2A:
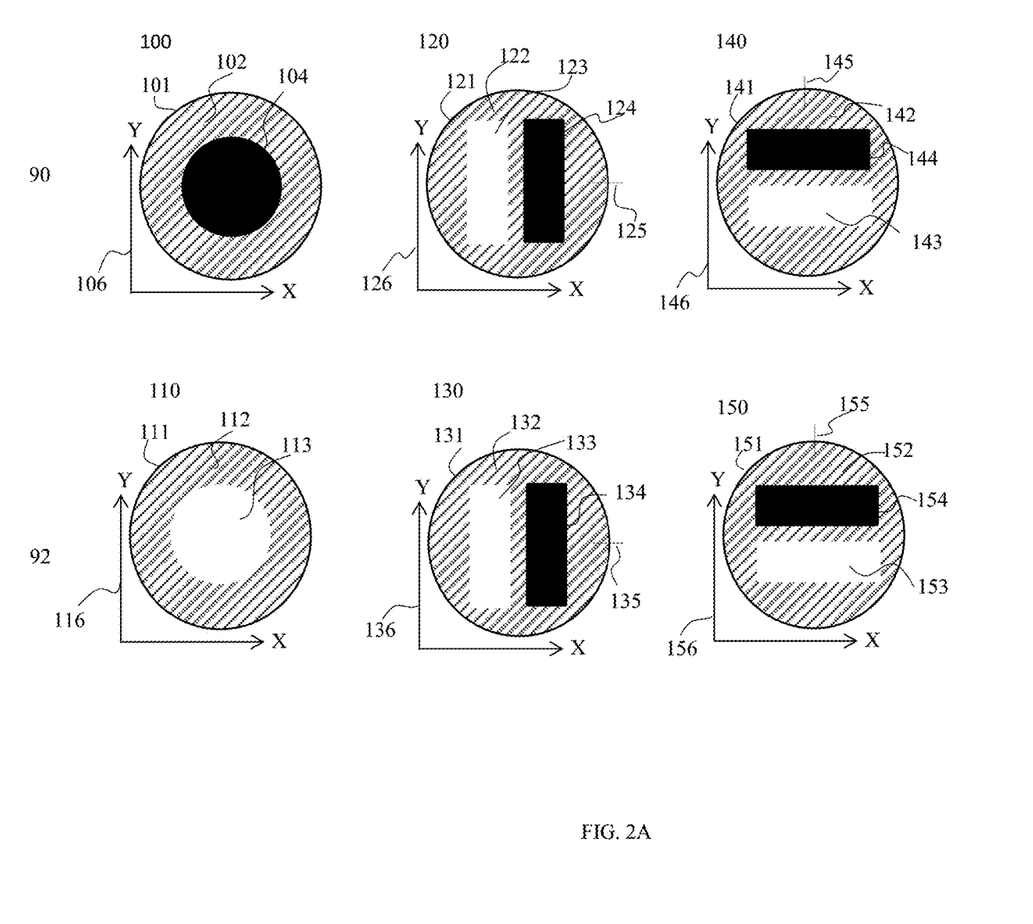
FIG. 2A depicts diagrammatically a collection of shim structures according to the present disclosure, being three first order structures.
Figure 2B:
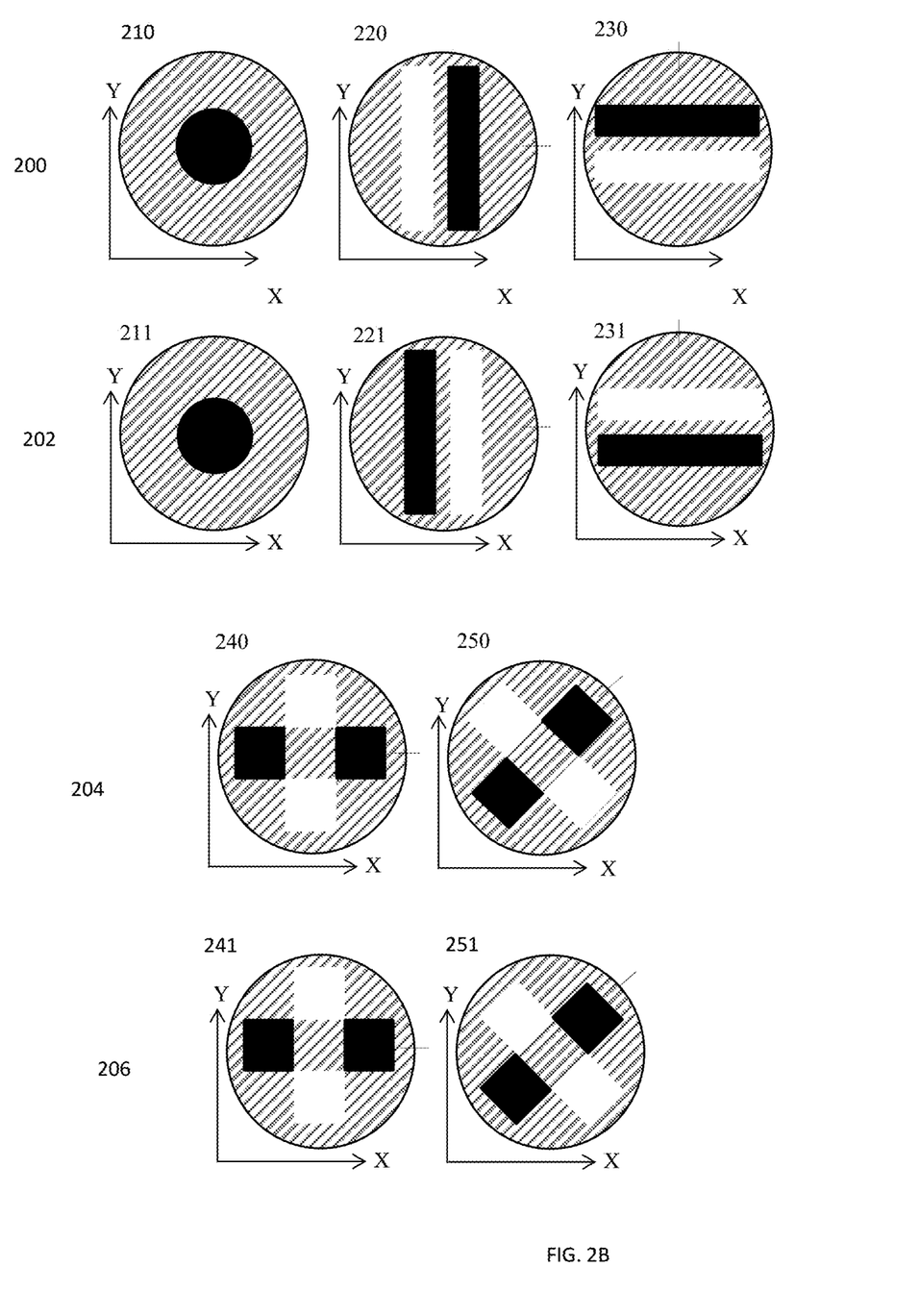
FIG. 2B depicts diagrammatically a collection of shim structures according to the present disclosure, being five second order structures.

FIGS. 2A and 2B illustrate examples of shim structures that produce some of the RVSH fields. These structures are designed following the methods of Anderson (Rev. Sci. Inst, 32, 241-250, 1961) for current-carrying active shims. More details on a particular implementation of the technology are supplied in A. F. McDowell, *J. Magn. Reson.* 296, 143-151, 2018. The three first order structures are shown in FIG. 2A. For each shim structure, there are two shim elements, one to go near or on the +Z pole of the magnet and one to go on or near the −Z pole of the magnet. The +Z elements are shown on the upper row 90 and the −Z elements are shown in the lower row 92. Both the +Z and −Z elements are required in order to produce one of the RVSH functions. The two elements together are referred to as a shim structure. For example, the (1,0) shim structure is made up of elements 100 and 110 (as seen one above the other at the left of rows 90, 92 of FIG. 2A. The (1,1) shim structure is made up of elements 120 and 130. The (1,−1) shim structure is made up of elements 140 and 150. The elements are shown within circles 101, 111, 121, 131, 141, and 151 denoting the outer edge of the magnetic material that produces the magnetic field of the shim. The dark black regions 104, 124, 134, 144, and 154 are regions of full-strength material, the white regions 113, 123, 133, 143, and 153 are regions without shim material, and the cross-hatched regions 102, 112, 122, 132, 142, and 152 are regions of half-strength material. The X and Y coordinate axes 106, 116, 126, 136, 146, and 156 indicate how the structures may be orientated when placed into position in the dipole magnet as in FIG. 1A. That particular orientation produces the field indicated by the names assigned above. The shim elements may also be mounted in other orientations, which will be described below. The orientation of the shim elements can be described by stating the angular position of the indicator marks 125, 135, 145, and 155. These passive shim implementations of Anderson's active shim design are meant solely to be illustrative. Other passive shim structures may be used to implement the newly disclosed passive shim technology.

The five second order structures based on the work of Anderson are shown in FIG. 2B. The light, dark, and hatched regions have the same meaning as described above for the three structures in FIG. 2A. The top row 200 depicts the three +Z-side elements 210, 220, and 230 for the (2,0), (2,1) and (2,−1) shim structures, respectively. The next row 202 depicts the corresponding −Z-side elements 211, 221, and 231. The next row 204 depicts the +Z-side elements 240 and 250 for the (2,2) and (2,−2) shim structures, with the bottom row 206 of FIG. 2B showing the corresponding −Z-side elements 241 and 251.

It is apparent from FIGS. 2A and 2B that the shim structures within a given order can be grouped into sets that have very similar physical layouts, differing only by rotation. For example, the (1,1) structure (elements 120 and 130), when rotated by an angle ϕ=90°, becomes the (1,−1) structure (elements 140 and 150). Likewise, the (2,1) structure (elements 220 and 221) becomes the (2,−1) structure (elements 230 and 231) upon rotation by ϕ=90°, while the (2,2) structure (elements 240 and 241) becomes the (2,−2) structure (elements 250 and 251) upon rotation by ϕ=45°. These pairings of structures (having similar physical layouts differing by a selected orientational rotation) define the sets of structures used to adjust the magnetic field of a magnet. One set, for example, contains the (1,1) and (1,−1) structures. Another set contains the (2,1) and (2,−1) structures. A third set contains the (2,2) and (2,−2) structures. Similarly, sets of structures that create higher order RVSH field distributions may be designed.

The RVSH functions are only one of many possible groups of functions that can form the basis for the apparatus and systems disclosed herein. A key feature of any group of functions chosen to form the basis for a passive shim design according to the present disclosure is that the functions can be organized into sets related by rotation. It may be useful for a set of functions (or corresponding shim structures) to have specific properties under rotation. These properties are easiest to discuss for the case when the set contains a pair of structures. For example, one property may be that the first structure of the pair must transform into the other structure of the pair after rotation by a specific angle ϕ$_A$. A second property may be that each structure of the pair must transform into its own inverse after rotation by a different specific angle ϕB. The (1,1) and (1, −1) structures in FIG. 2A have these properties, as do the pair (2,1)-(2,−1) and the pair (2,2)-(2,−2) in FIG. 2B. We denote these pairs using the notation {1, ±1}, {2, ±1}, and {2, ±2}. For the example implementation of the newly disclosed shim technology based on RVSH functions, these pairs are examples of sets of shim structures that each individually are capable of creating identical magnetic field distributions.

Given an appropriate choice of sets of functions and the design of structures that create the fields described by those functions, the presently disclosed apparatus and system are practiced by constructing the corresponding sets of shim structures that produce the fields. The structures may be constructed by cutting or layering thin pieces of magnetically active material, for example shim stock, following a pattern of cuts known to create the desired fields. Examples of such patterns, based on the work of Anderson, are given in FIGS. 2A and 2B. Other construction methods are possible, as discussed below. Each member of the set of structures may be identical, up to a rotation, due to the required rotational properties. When used by themselves, each single member structure of the set produces a magnetic field distribution with a definite shape and magnitude that can be denoted $G_n$. For example, a single member of the {1, ±1} pair might produce a field gradient $G_{11}$=2.5 G/mm, to pick an arbitrary concrete value, in a direction determined by the orientation of the shim structure. Each member structure of the set may be marked with a line, dot, or other marking so that its orientation may be specified. The thin lines 125, 135, 145, and 155 in FIG. 2A, crossing the outer circular edge of the paired elements, are an example of such a marking. The exact angular location of this marking on the structure may be any value, but it is helpful to mark the members of the set identically.

For ease of discussion, we consider a set of structures used to create a specific correction field to have two members. The two members of the pair of structures will typically be used at the same time, with the first member of the pair being orientated at an angle ϕ$_1$ and the second being orientated at an angle ϕ$_2$, which may be the same or different from ϕ$_1$. The choice of the two angles ϕ$_1$ and ϕ$_2$ allows for the production of a corrective field of any value from 0 to the sum of the strengths of the individual structures, and oriented in any direction. In this way, the fixed-strength passive structures in the pair can be manipulated to produce a continuously adjustable magnetic field distribution strength.

For example, if the two members of the {1, ±1} pair are oriented at the same angle (ϕ$_1$=ϕ$_2$), then they together produce a field of strength 2G$_{11}$ in the direction corresponding to ϕ$_1$. If they are oriented in opposition (e.g., ϕ$_2$=ϕ$_1$+180°), then together they produce no (1,1) or (1,−1) fields. In that configuration, the fields from each individual member of the pair are equal and opposite. To produce a field of intermediate strength, other angles can be chosen. For example, to produce a field of strength 0.75 G$_{11}$ along the 0° direction, the two members of the pair should be oriented symmetrically with respect to 0°, that is, with ϕ$_2$=−ϕ$_1$. The required value of the angle ϕ$_1$ satisfies cos(ϕ$_1$)=0.75/2, or ϕ$_1$=68.0°. The extension of this approach to producing a total shim field of a different intermediate value, or of an orientation different from 0°, is an exercise in basic trigonometry readily carried out by one skilled in the art.

Figure 3A:
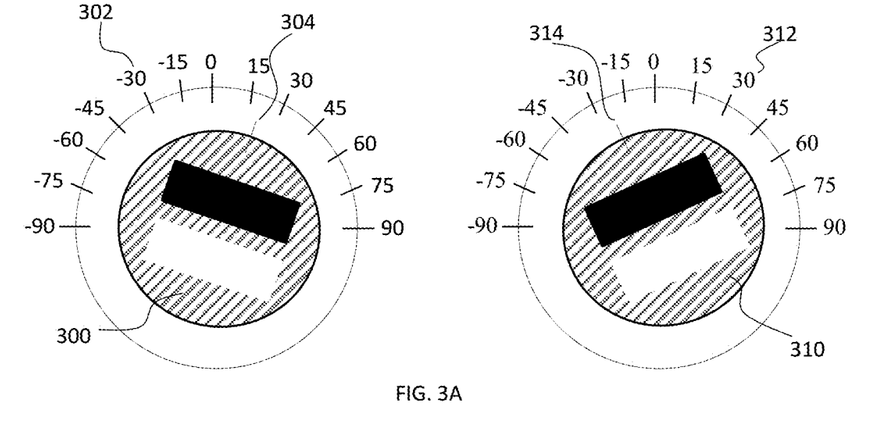
FIG. 3A is a diagram showing a pair of passive shim structures usable according to the present disclosure to create a variety of linear gradient strengths, in which each structure of the pair includes two elements, one mounted near each magnet pole, with the orientation of that member of the pair specified by the angle by $\phi$; the two +Z side elements are shown, one oriented at $\phi_1 = +20°$, and the other oriented at $\phi_2 = -20°$.
Figure 3B:
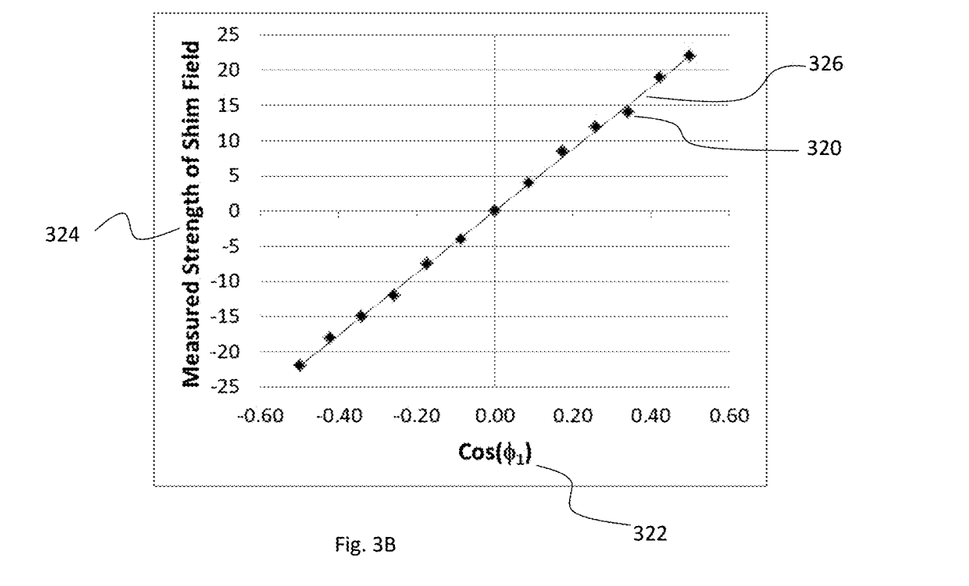
FIG. 3B is a graph providing data from field measurements resulting from a mounted pair of shim structures (per FIG. 3A) according to the present disclosure to determine the strength of measured (1,1) and (1,−1) fields, and showing the results for the case where $\phi_2 = \phi_1$; the measured field strengths, shown as dots, are plotted versus the cosine of the angle $\phi_1$.

FIGS. 3A and 3B show data demonstrating that a {1, ±1} pair of passive structures can be used to create a variety of linear gradient strengths. These shim structures were mounted at various orientations near the poles of a dipole magnet, at locations 14 and 16 in FIG. 1A. Each member structure of the pair consisted of two elements, one mounted near each pole, with the orientation of that member of the pair specified by the angle ϕ$_1$. The other member structures of the pair also consisted of two elements, one mounted near each pole, with an orientation specified by ϕ$_2$. In a typical case, the regions near each pole held two elements each, placed at different orientations. An example is depicted in FIG. 3A, where the two +Z side elements 300 and 310 are shown, one oriented 304 at ϕ$_1$=+20°, and the other shown 314 at ϕ$_2$=−20°. The circles 302 and 312 of angular values may be fixed with respect to the magnet and used to indicate the orientations of the elements 300 and 310. The field resulting from the mounted pair was measured using standard field mapping methods as known in the art, and the field maps were analyzed to determine the strength of the measured (1,1) and (1,−1) fields.

FIG. 3B shows the results for the case where ϕ$_2$=−ϕ$_1$. The measured field strengths 324, shown as dots 320, are plotted versus the cosine of the angle ϕ$_1$ 322. The expected behavior is shown by the line 326. The data follow the expected line closely, implying that any value of magnetic field distribution strength could be produced simply by utilizing the correct angles, which are readily calculated. Extension of the method in order to produce a field in a different direction is readily understood by one of ordinary skill in the art. For example, it is recognized that the two members of the pair work together to form a field that is the linear combination of their individual fields. The production of a linear gradient field in a different direction reduces to the problem of finding the correct linear combination coefficients to create the desired field.

Figure 4:
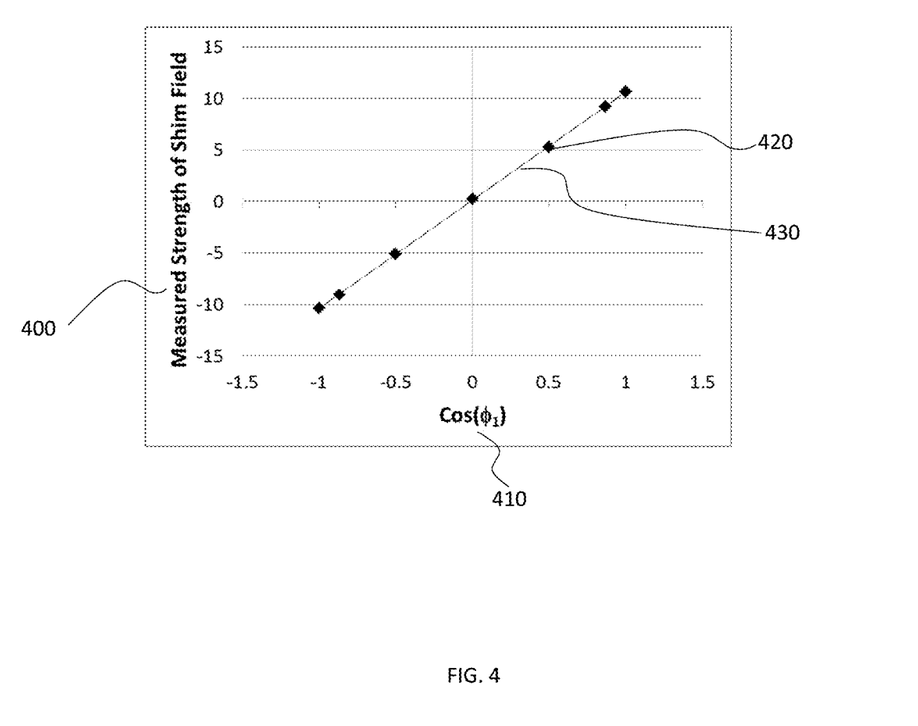
FIG. 4 is a graph showing data from measurements that demonstrate the use of orientation to produce a variety of strengths of the $\{2, \pm 1\}$ field from a pair of fixed-strength structures according to the present disclosure, plotting the measured strength of the shim field as a function of the cosine or the orientation angle $\phi$.

The method readily extends to higher order shim fields. For example, the {2, ±1} pair (220, 221 and 230, 231 in FIG. 2B) have the same rotational properties as the {1, ±1} pair discussed above. FIG. 4 shows data from measurements that demonstrate the use of orientation to produce a variety of strengths of the {2, ±1} field from a pair of fixed-strength structures. For the measurement results shown in FIG. 4, the (2,1) structures where produced by printing magnetic ink. As in FIG. 3A, each member of the pair was mounted near the poles 14 and 16 of a dipole magnet so that the orientation angles obeyed $\phi_2 = -\phi_1$. In FIG. 4, the measured strength 400 of the (2,1) shim field is plotted as dots 420 versus the cosine of the angle $\phi_1$ 410. The line 430 gives the expected dependence. As for the {1, ±1} pair, the data show that any value of the (2,1) field strength can be made by calculating and implementing the correct value for the individual orientation angles $\phi_2$ and $\phi_1$. Extension of the approach to produce magnetic field distributions oriented along other axes is again an exercise in trigonometry well within the ability of one skilled in the art.

Figure 5:
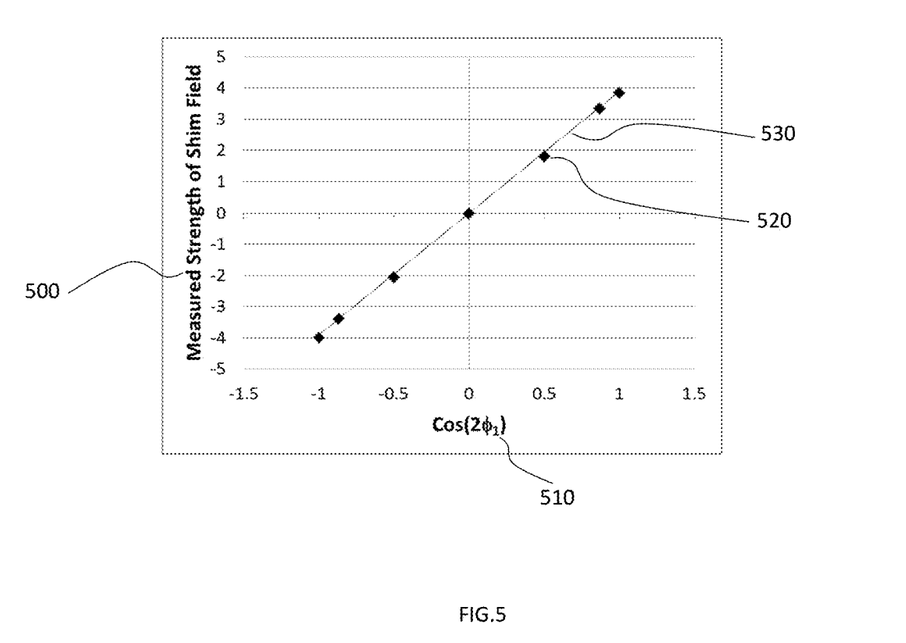
FIG. 5 is a graph showing that a $\{2, \pm 2\}$ pair of shims according to the present disclosure can be manipulated to produce a continuous range of field strength values and orientations. The data for a $\{2, \pm 2\}$ pair is graphed, showing the strength of the measured (2,2) field plotted versus the cosine of twice the angle $\phi_1$; the dots represent the measured values of shim field strength, while the line illustrates the expected behavior.
Figure 6A:
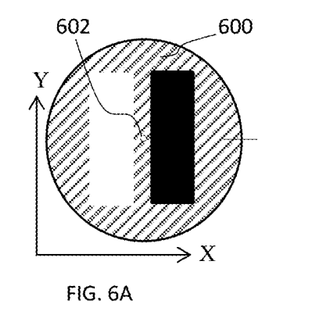
FIG. 6A shows a single $\{1, \pm 1\}$ element, similar to those shown in FIG. 2A but with a small hole at its center.
Figure 6B:
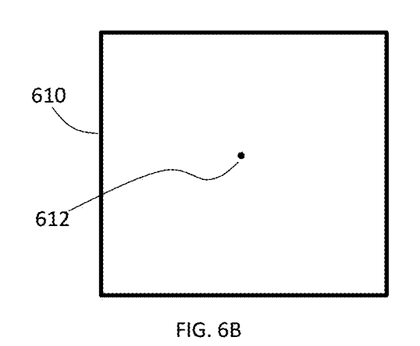
FIG. 6B depicts a support structure with a small axle at its center.
Figure 6C:
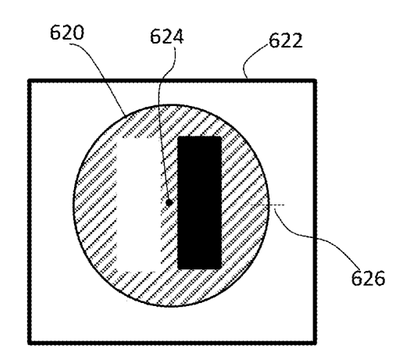
FIG. 6C shows an element (similar to element of FIG. 6A) placed on the support structure, with its hole mounted over the axle and oriented so that its indicator line points to the right.
Figure 6D:
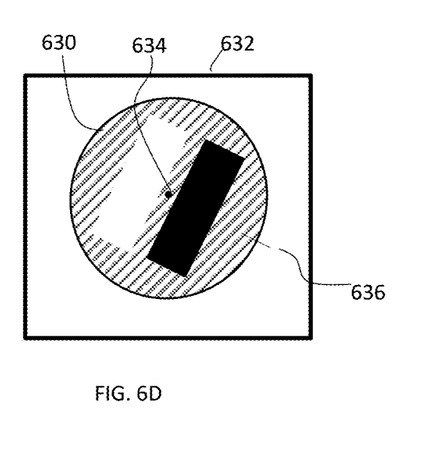
FIG. 6D shows the element mounted on the axle on the support structure, after the element has been rotated clockwise through a small angle.

The {2, ±2} pair also can be manipulated to produce a continuous range of field strength values and orientations, but the behavior of this pair is slightly different. Because this pair has two-fold rotation symmetry, rather than the one-fold symmetry of the {1, ±1} and the {2, ±1} pairs, the relevant orientations span a smaller range. In particular, if the two members of the {2, ±2} pair are mounted at 90° with respect to each other, their fields oppose and the pair produces no net field. The data for the {2, ±2} pair are shown in FIG. 5. The strength of the measured (2,2) field 500 is plotted versus the cosine of twice the angle $\phi_1$ 510. The dots 520 represent the measured values, while the line 530 is the expected behavior. With orientations that obey $\phi_2 = -\phi_1$, the field produced has the shape of the (2,2) field (also known as ($X_2$-$Y_2$)). If both members of the pair were rotated by 45°, the fields produced would have the shape of the (2,-2) field (also known as XY). With this information, one of ordinary skill in the art will be able to determine how to produce any linear combination of the (2,2) and (2,-2) fields.

The new passive shim method extends to higher order fields. In the third order, the pairs of RVSH functions that have the requisite rotation symmetries are {3, ±1}, {3, ±2}, and {3, ±3}. A pair of passive shim structures that make the (3,1) and (3,-1) fields can be mounted at particular orientations to make any linear combination of these two fields. The {3, ±1} pair has the same angular dependence as the {1, ±1} and {2, ±1} pairs. The {3, ±2} pair has the same angular dependence as the {2, ±2} pair. The {3, ±3} pair has a distinct dependence on angles. If the members of this pair are mounted at a relative angle of 60°, they produce no net field. The implication of this different angle value for the design and utilization of the higher order field distribution functions should be clear to those of ordinary skill in the art, as should the extension to even higher mathematical orders.

To correct or shim the magnetic field of a magnet using the newly disclosed technology, all required sets or pairs of shim structures can be constructed. Once placed at the correct the angles in the magnet, the field of the shim pairs can be made to cancel out undesired components in the field of the magnet. The adjustment of the orientations of each member of each pair may be made on the basis of an analysis of a map of the magnet to be corrected, or on the basis of analysis of a signal, such as the line shape of an NMR signal, that may be produced as a consequence of the magnetic field, or by any other means.

The adjustments of orientation may be made without removing the shim structures from the target magnet. The apparatus and system of this disclosure thus offer a benefit that the magnetic field of a target magnet is adjustable while the shim structures are disposed on or in the target magnet. The adjustments may be made with the shim structures removed from the magnet. The shim structures may be subsequently reinstalled in the magnet. The desired orientation for the shim structures may be calculated on the basis of the geometry of the magnet, on the basis of direct or indirect measurements of the magnetic field distribution in the magnet, or other means. The calculated desired shim orientations may be implemented before the first time the shim structures are placed in the magnet. The shim structure orientations may be subsequently adjusted to improve the magnetic field. On the other hand, the shim structures may be placed into a particular orientation one time only and then not further adjusted. The orientable shim structures may serve as a rough or first-pass correction.

The shim structures may be positionable within a limited range, or a plurality of defined ranges, of orientations, rather than being positionable at any possible orientation. For example, if the optimal orientations of the structures can be calculated or known in advance, the structures may be positioned with these optimal orientations and implemented to adjust the magnetic field of the magnet. If subsequent changes to the orientations are deemed advantageous, these changes may be expected to be small and may not require that any possible orientation of the structures be achievable. The manner in which the shim structures are mounted, and/or the manner in which the shim structure orientations are manipulated, may be such that the shim structures may only be able to adopt orientational positions within a limited range. Limiting the possible orientations to lie with a certain range or ranges may offer advantages for the mechanical design of the structures. Such limitations may also improve the accuracy or robustness of the shim structure orientation adjustment process.

The shim structures may be of the same design for a series of magnets of the same design. The shim structures may be mass produced, for example in a production run independent from the production of the magnets. The shim structures for use in a particular one of the magnets may be individually tailored for that magnet by adjusting the orientations of the shim structures. This adjustment may result in orientation angles that are unique to that magnet, and may be different from the orientation angles appropriate to a different individual magnet of the same nominal design.

The sets of structures that create identical magnetic field distributions in space may consist of two or more structures that are all identical. The structures in a set may be constructed from four or more elements that are identical. The structures may be passive and may create a magnetic field distribution without utilizing electrical currents to create the field. The structures may be active and may create the magnetic field distribution through the use of electrical currents.

The structures may be dominantly planar in geometry, for example, a flat sheet or plate. The axis of rotation of rotation may be perpendicular to the sheet. The structures may be dominantly cylindrical in geometry. The axis of rotation may be along the geometrical axis of the cylinder.

The correction, adjustment, or modification of the magnetic field of a magnet may be carried out utilizing a single set of structures that are each capable of creating the same magnetic field. The correction, adjustment, or modification of the magnetic field of a magnet may be carried out using a plurality of such sets of structures. The plurality of the sets of structures may be sufficient for the correction of the magnetic field of a magnet to a high level of homogeneity, as might be required for Nuclear Magnetic Resonance spectroscopy or Magnetic Resonance Imaging.

The axis of rotation for the structures of a set may all be located at a common position in space. The axis of rotation for different sets of structures may be located at position in space in common with some or all the other sets, or each set may have its own unique axis position in space. The axis of rotation may be perpendicular to the structure, may intersect the structure at an oblique angle, may line within the structure, or may lie completely outside of the structure without intersecting it. The axis may correspond to a physical attribute of the structure, such as an axle or hole, or the axis may be entirely an abstract mathematical construct without correspondence to a physical manifestation.

The members of any pair of shim structures may be placed at specific orientational positions in a variety of ways. For example, the members of the pair may be positioned at the desired orientation and then fixed in place, using tapes, adhesives, clamps, mechanical fasteners or other methods. The shim structures may be mounted to a support structure that itself is not intended to modify the magnetic field. Shim structures mounted this way may not need to be constrained by any other structures or means. The methods used to mount the shim structures at the desired orientations may be permanent or may be removable or repositionable. Alternatively, the members of any pair of shim structures may be mounted in such a way that they are constrained to rotate about an axis. The members of the pair may then be placed into the desired angular positions by rotating them into position. The constraints may be internal to the shim structure, for example, an axle or post or pin at the center of rotation, or a set of pins, arcs, or other mechanical positioners that move in circular slots in the shim structure.

FIG. 6 shows an example of the use of an axle to constrain the rotation of shim elements. FIG. 6A shows a single {1, ±1} element 600, similar to those shown in FIG. 2A but now with a small hole 602 at its center. FIG. 6B depicts a support structure 610 with a small axle 612 at its center. FIG. 6C shows the element 620 (similar to element 600 of FIG. 6A) now placed on the support structure 622 (similar to support structure 610), with its hole (similar to hole 602) mounted over the axle 624 (similar to axle 612) and oriented so that its indicator line 626 points to the right. FIG. 6D shows the same element 630 mounted on the axle 634 on the support structure 632 after the element has been rotated clockwise through a small angle 636. More elements may be similarly mounted on the axle and rotated to their individual orientation positions. The support structure with the elements mounted on the axle, may now be placed into the magnet.

It may be appreciated by those skilled in the art that other mechanical means may be used to position the structures. For example, the axle may be attached to the shim structure element and the hole may be in the support structure. The axle may be attached to a shim structure element and other shim structure elements may be equipped with a mounting hole. The axle-bearing shim structure may play the role of the support structure.

Figure 7A:
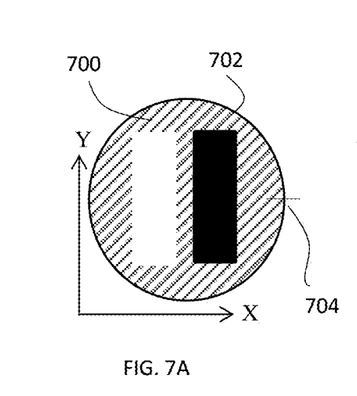
FIG. 7A shows a $\{1, \pm 1\}$ element of circular form, with the line segment indicating the orientation.
Figure 7B:
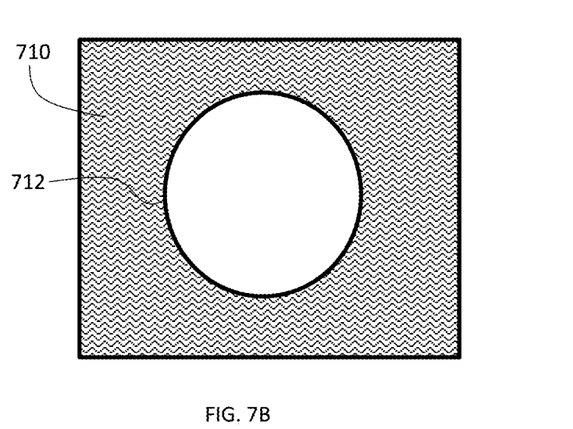
FIG. 7B shows a portion of shim support material having a circular depression or hole just large enough to accept the shim element.
Figure 7C:
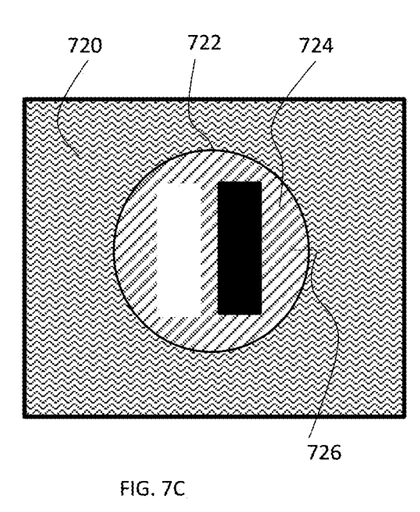
FIG. 7C shows the shim element situated in the circular depression of the support structure, oriented so that its indicator line is directed to the right.
Figure 7D:
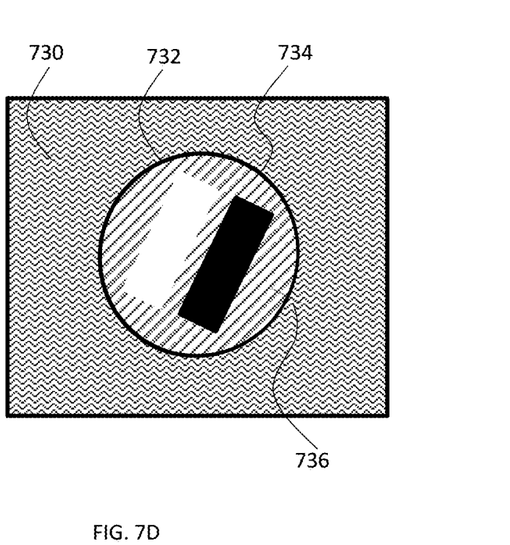
FIG. 7D shows the element of FIG. 7C in the depression in the support structure, after having been rotated clockwise through a small angle.

The constraints may be external, for example a circular depression or hole in a structure that hold the shim structures, which may be built to have a circular outer edge, positioned such that the shim structures can only rotate around their axis of rotation. FIG. 7 shows an example of an external rotation constraint. FIG. 7A shows a {1, ±1} element 700 of circular form 702. The line segment 704 shows the orientation. FIG. 7B shows a piece of shim support material 710 with a circular depression or hole 712 in it, just large enough to accept the shim element. FIG. 7C shows the shim element 724 in the circular depression 722 in the support structure 720, oriented so that its indicator line 726 points to the right. FIG. 7D shows the same element 734 in the depression 732 in the support structure 730 after having been rotated clockwise through a small angle 736. More than one shim element may be placed into the depression and rotated to its individual angular position. The support structure, with the shim element (or multiple such shim elements) in the depression may now be placed into the magnetic field. Instead of a circular well or depression, the external constraint may be a set of raised posts, arcs, or other structures sufficient to constrain the motion of the shim elements to be rotation about their axis of symmetry.

A mounting of the shim structures to allow constrained rotation is particularly well suited for adjusting the orientations of the shim structures in situ, that is, while the shim structures stay installed in the magnet. When the shim elements are mounted such that they are constrained to rotate, it may be helpful to have the outer diameter of the circular shim elements be of different sizes, so that each member of the pair and each different pair may be separately manipulated so as to position it at the desired angle. Other positioning aids may be employed, including tabs or extensions along the outer edge of the individual shim elements that allow them to be manipulated individually.

It may also be useful to attach each shim element to a motor or other mechanical device that is configured so that it can move the shim element to a new angular position. Such motors or mechanical devices may be controlled manually or may be controlled by an automation system, such as a computer or microcontroller.

The shim elements themselves may be constructed using additive methods, such a printing with magnetic ink or magnetic polymers, or other materials appropriate for additive manufacturing methods. The shim elements may be produced by subtractive processes, such as cutting, patterning, or machining of bulk magnetically active materials. The shim elements may be built up out of layers of foils or sheet stock so as to achieve the correct distribution of material to produce the desired magnetic field. The shim elements may be made from hard magnetic materials, such as neodymium-iron-boron, Samarium-cobalt, AlNiCo, hard ferrites, or other materials known in the art. The shim elements may be made from soft magnetic materials, such as low-carbon steel, nickel, or other material. The shim elements may be made from a collection of small magnetically active materials ("buttons"). The new method disclosed herein may work with any set of shim structures with appropriate propertied under rotation, regardless of the methods used to produce the elements.

A given pair of shim structures can produce a maximum strength shim field. In the case where this maximum strength is not adequate, a second pair of shim structures, creating the same shape of field, can be made using more magnetic material so to enable the production of stronger maximum strength fields.

The shim technology disclosed herein may also be used to create dynamically adjusted, time-dependent magnet fields. For example, in pulsed-field-gradient measurements of physical parameters such as diffusion, velocity, etc., the {1, ±1} shim structures may be manipulated quickly, during the course of a measurement, so as to create the pulse of magnetic field gradient required to make the measurement. Magnetic resonance imaging is another measurement technique that requires time-dependent magnetic field manipulations, specifically pulsed linear gradients. These can be created by manipulating the {1, ±1} in real time, during the measurement. Any of the shim structures that can be manipulated in real time may be utilized to give a controlled, time-dependent magnetic field distribution.

Only some embodiments of the invention and but a few examples of its versatility are described in the present disclosure. It is understood that the invention is capable of use in various other combinations and is capable of changes or modifications within the scope of the inventive concept as expressed herein. Modifications of the invention will be obvious to those skilled in the art and it is intended to cover by the appended claims all such modifications and equivalents. The entire specifications of all patents cited herein above are hereby incorporated by reference.

What is claimed is:

1. An apparatus for adjusting the magnetic field of a magnet, comprising:
    at least one set of at least two passive shim structures, each individual shim structure capable of creating an associated corrective magnetic field distribution in a working volume of the magnet;
    the corrective magnetic field distribution associated with each individual shim structure having a mathematical form with a fixed shape and strength;
    the mathematical form of each corrective magnetic field distribution having an orientation in space determined by the orientation of its associated individual shim structure;
    the individual shim structures of the at least one set of shim structures being orientable independently of the orientations of the other shim structures in the set;
    a net corrective magnetic field distribution produced collectively by all shim structures of the at least one set having a net mathematical form with a fixed shape; and
    the net mathematical form having a strength and an orientation determined by the orientations of the individual shim structures of that set;
whereby the individual shim structures of the at least one set may be placed with orientations such that their total corrective magnetic field distribution cancels an undesired component in the magnetic field of the magnet.

2. The apparatus of claim 1 wherein the at least one set comprises a plurality of sets of shim structures, and wherein the net corrective magnetic field distribution created by the shim structures in each set defines a definite shape distinct from the shape of the net corrective magnetic field distribution created by any other set.

3. The apparatus of claim 1 wherein each shim structure of a single set is capable of creating the same magnetic field distribution.

4. The apparatus of claim 3 wherein the shape of the net corrective magnetic field distribution created by the all shim structures of the set is the same as the shape of the associated field distribution created by each shim structure, and the strength and orientation of the net corrective magnetic field distribution created by the shim structures is different from the strength and orientation of the associated field distribution created by each shim structure.

5. The apparatus of claim 1 wherein the shim structures of any set share a common designated axis of rotation, and wherein the designated axis of rotation is always at a single location in space.

6. The apparatus of claim 1 wherein the shim structures are supported by a mechanical support structure.

7. The apparatus of claim 1 wherein at least one of the sets comprises a pair of identical shim structures.

8. The apparatus of claim 1 wherein the net corrective magnetic field distribution created by the shim structures is described by a real-valued spherical harmonic function.

9. The apparatus of claim 1 wherein the shim structures comprise a magnetically soft material.

10. The apparatus of claim 1 wherein the shim structures comprise a magnetically hard material.

11. The apparatus of claim 1 wherein the shim structures are mass produced, and wherein magnetic fields of a plurality of magnets are adjustable using the mass-produced structures.

12. The apparatus of claim 1 wherein the magnetic field of the magnet is adjustable time-dependently by movement of at least one passive shim structure.

13. The apparatus of claim 1 wherein the magnetic field of the magnet is adjustable while the shim structures are on or in the magnet.

14. The apparatus of claim 1 wherein the shim structures are positionable at any angular orientation within a plurality of ranges of orientations.

15. The apparatus of claim 14 wherein the shim structures are positionable at an angular orientation within a single limited range of orientations.

\* \* \* \* \*